United States Patent [19]

McDermid

[11] Patent Number: 5,539,330
[45] Date of Patent: Jul. 23, 1996

[54] INTERCONNECT BUS SYSTEM FOR USE WITH SELF-CONFIGURING ELECTRONIC CIRCUIT MODULES

[75] Inventor: William J. McDermid, Niwot, Colo.

[73] Assignee: Adaptive Systems, Inc., Niwot, Colo.

[21] Appl. No.: 433,723

[22] Filed: May 3, 1995

[51] Int. Cl.$^6$ ............................................. H03K 19/177
[52] U.S. Cl. ................................ 326/39; 326/41; 326/62
[58] Field of Search ............................ 326/39–41, 47, 326/62

[56] References Cited

U.S. PATENT DOCUMENTS

4,885,482  12/1989  Sharp et al. ............................. 326/47
5,406,056  11/1995  Hsieh et al. ............................. 326/41

Primary Examiner—David R. Hudspeth
Attorney, Agent, or Firm—Duft, Graziano & Forest

[57] ABSTRACT

An interconnect bus system that includes an interconnect bus having a plurality of interconnect bus conductors, a reference circuit for placing a reference signal on certain of the interconnect bus conductors, and at least one electronic circuit module having a plurality of electronic circuit module conductors in addition to a configuration circuit, a bus interface, and an application circuit thereon. The electronic circuit module conductors can be in one of four physical orientations relative to the interconnect bus conductors. The configuration circuit can sense the reference signal and determine the electronic circuit module's physical orientation relative to the interconnect bus. The configuration circuit configures the bus interface based on the present physical orientation. The bus interface routes signals to and from the interconnect bus conductors on behalf of the application circuit in a manner transparent to both the interconnect bus conductors and the application circuit regardless of the present physical orientation of the electronic circuit module conductors relative to the interconnect bus conductors.

15 Claims, 8 Drawing Sheets

INTERCONNECT BUS SYSTEM FOR USE WITH SELF-CONFIGURING ELECTRONIC CIRCUIT MODULES

FIELD OF THE INVENTION

The present invention relates to interconnect buses, and in particular, to an interconnect bus system for use with self-configuring electronic circuit modules that can be positioned in any one of a plurality of orientations relative to an interconnect bus.

PROBLEM

It is a problem in the field of electronics to design and build electronic devices quickly and inexpensively where physical design constraints require that electronic components within the electronic device connect to a bus in a variety of non-standard physical orientations.

The typical bus includes a plurality of electrical conductors arranged in a fixed order each in a fixed location. Each electrical conductor serves as a path shared by any of a plurality of electronic components connected to the bus.

The typical electronic component in an electronic device includes a plurality of electrical conductors arranged in a fixed order in a fixed location that directly corresponds to the order and location of each electrical conductor on the bus. Electronic components, more generally called electronic circuit modules, that are commonly interconnected by a bus include circuit boards, single chip devices, or other prepackaged electronic components.

One problem with existing bus and electronic circuit module systems is that the electronic circuit modules are restricted to connecting to the bus in only one physical orientation relative to the bus. Connecting an electronic circuit module to the bus in any orientation other than the designed orientation can damage the bus and/or electronic circuit module or render the electrical connection inoperable. In addition, the single orientation restriction can severely constrain a product's overall architecture and ultimately affect the product's size, shape, and performance. If a non-standard physical orientation is desired between the bus and any one electronic circuit module, a custom designed bus and/or electronic circuit module is required. However, custom designs are undesirable due to their expense and adverse impact on a product's market price. Even if a vendor makes an electronic circuit module available in a variety of different designs so that each module provides of a different physical orientation relative to a bus, a practical limit exists to the number of combinations a vendor can economically provide given the number of combinations that can exist. In addition, if a product prototype requires that an electronic circuit module be connected to a bus in a non-standard physical orientation and no "off the shelf" hardware is available to accommodate the design, an entire product design and/or manufacturing window may be missed due to the expense and time required to design a custom bus and/or accompanying electronic circuit module.

A flexible cable bus interconnecting multiple electronic circuit modules is one attempt at facilitating non-standard physical orientations between electronic circuit modules and the electrical conductors on a bus. Although the single orientation restriction of an electronic circuit module relative to the electrical conductors on the bus is compensated for by the flexibility of the flexible cable bus, there is a practical limit to the number of twists that can be introduced into a flexible cable, and the physical length of the flexible cable can have undesirable effects on signals due to noise, signal delay, or signal distortion.

For these reasons, it is desirable to provide an interconnect bus system that accommodates multiple connection orientations between an interconnect bus and any one electronic circuit module connecting to the bus without requiring a custom designed interconnect bus and/or electronic circuit module.

SOLUTION

The above described problems are solved and a technical advance achieved in the field by the interconnect bus system for use with self-configuring electronic circuit modules. The interconnect bus system of the present invention includes an interconnect bus having a plurality of interconnect bus conductors in a fixed order originating from an interconnect bus base. The interconnect bus system also includes a plurality of electronic circuit modules each having a plurality of electronic circuit module conductors over which an application circuit on the module accepts input signals from the interconnect bus and sends output signals to the interconnect bus. An electronic circuit module is a generic category of electronic devices that may include, but is not limited to, a circuit board, a single chip device, a prepackaged modular device, or any other electronic device or component capable of connecting to the interconnect bus.

The interconnect bus system operates in one of two cycles—a configuration cycle or an operational cycle. A configuration cycle can occur at any time and any electronic circuit module connected to the interconnect bus can request a configuration cycle by placing a predefined configuration signal on the interconnect bus. A reference circuit responds to the configuration signal by providing a reference signal on specific interconnect bus conductors. The reference signal is unique and is sensed by the configuration circuits on each electronic circuit module thereby enabling each electronic circuit module to determine its orientation relative to the interconnect bus and configure a bus interface accordingly. Once the bus interface is configured, the configuration cycle is complete and the operational cycle(s) begin.

In an operational cycle, the bus interface routes signals to and from an application circuit on the electronic circuit module in a manner that is transparent to the application circuit and the interconnect bus regardless of the physical orientation of the electronic circuit module relative to the interconnect bus. Operational cycles include, but are not limited to, read cycles, write cycles, arbitration cycles, and error reporting cycles.

In one embodiment, the interconnect bus conductors are rigid pins designed to pass through correspondingly spaced receptacles that are the electronic circuit module conductors. Because the interconnect bus conductors pass through the electronic circuit module conductors, the electronic circuit module is slidably connected to the bus in any one of four orientations relative to the interconnect bus conductors. By extending the length of the interconnect bus conductors, multiple electronic circuit modules can be stacked onto the interconnect bus in a substantially linear fashion.

In a second embodiment, the interconnect bus conductors are embedded in a flexible cable having cable termination blocks that interconnect multiple electronic circuit modules in any of the four orientations relative to the interconnect bus conductors. This eliminates the need to twist the flexible cable to achieve one of the four electronic circuit module orientations. The second embodiment also permits electronic circuit modules to connect to a substantially non-linear interconnect bus.

In another embodiment, the rigid and flexible interconnect bus systems of the previous two embodiments are combined for still further flexibility to interconnect multiple electronic circuit modules in substantially linear and non-linear fashions.

In any of the above embodiments, each electronic circuit module is self-configuring relative to the interconnect bus conductors due to the previously mentioned reference circuit that is unique to the interconnect bus and the configuration and interface circuits on each electronic circuit module.

DETAILED DESCRIPTION

Interconnect Bus System Symmetry—FIGS. 1a–1d

FIGS. 1a–1d illustrate the symmetry upon which the present invention is based. For purposes of this discussion, it is important to note that dots d0–d10 are a top end view of pin style conductors making up an interconnect bus, where each conductor remains in a fixed position for FIGS. 1a through 1d. Similarly, circles c0–c10 are a top end view of receptacle style conductors on an electronic circuit module that can move as an ordered unit from FIGS. 1a through 1d depending on the electronic circuit module's orientation relative to the interconnect bus' pin style conductors. Central to this illustration is that there are only four possible orientations of circles to dots if the dots remain in a fixed position in FIGS. 1a through 1d and the circles move as an ordered unit among FIGS. 1a through 1d.

Figure 1A:
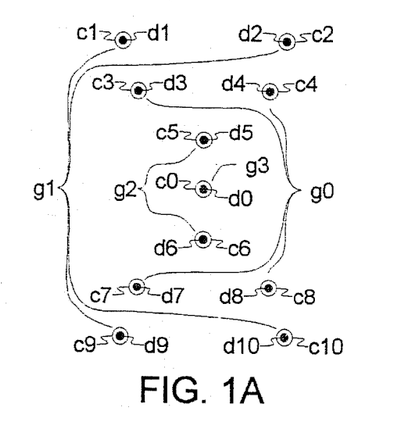
FIGS. 1a–1d illustrate the interconnect bus system symmetry.
Figure 1B:
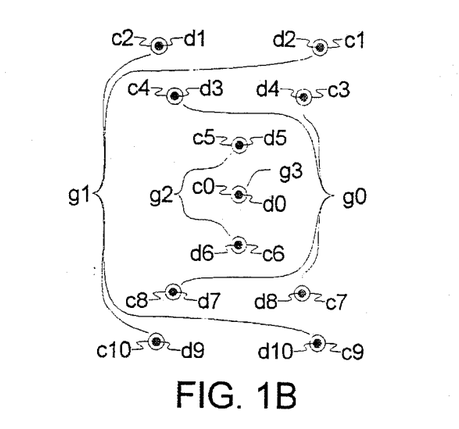
Figure 1C:
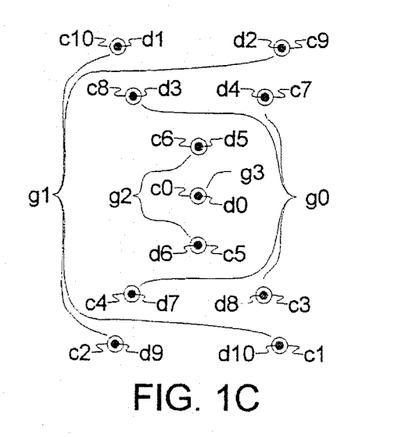
Figure 1D:
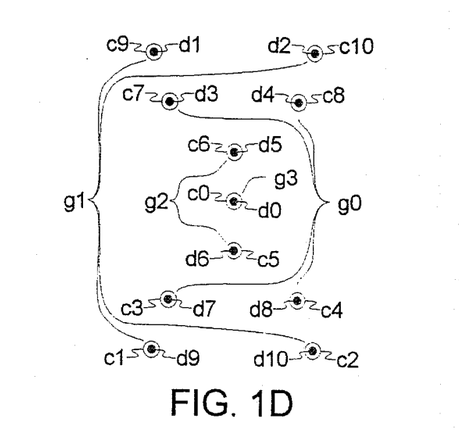

FIG. 1a illustrates the first orientation of circles relative to fixed position dots in that circle c0 corresponds to dot d0 and circle c10 corresponds to dot d10. FIG. 1b illustrates the second orientation of circles relative to fixed position dots in that the FIG. 1b circles are a mirror image about a vertical axis from the FIG. 1a circles. FIG. 1c illustrates the third orientation of circles relative to fixed position dots in that the FIG. 1c circles are a mirror image about a vertical and horizontal axis from the FIG. 1a circles. Finally, FIG. 1d illustrates the fourth orientation of circles relative to fixed position dots in that the FIG. 1d circles are a mirror image about a horizontal axis from the FIG. 1a circles. No other orientations are possible between the circles c0–c10 and the fixed position dots d0–d10.

It is important to note that circle c0 remains in the same position for all four orientations in FIGS. 1a–1d. Similarly, circles c5 and c6 remain in the same position for two of the orientations, either FIGS. 1a–1b or 1c–1d. The remaining circles c1–c4 and c7–c10 change positions for each of the four orientations in FIGS. 1a–1d. Because circle c0 remains in the same position in all four orientations, circle c0 is a symmetrical member of a one conductor group g3. Circles c5 and c6 are symmetrical members of a 2 conductor group g2. Circles c1, c2, c9, and c10 are symmetrical members of a four conductor group g1. The remaining circles c3, c4, c7, and c8 are symmetrical members of a four conductor group g0 different from the conductor group g1. The dots d0–d10 are similarly grouped because they are positioned to receive symmetrical members of the various conductor groups described above.

The present invention draws on the principle that certain design decisions can be made once the conductor groups are identified for a given number of conductors. The number of conductors is the same whether the count, is made from the interconnect bus conductor perspective or the electronic circuit module conductor perspective. For example, electronic circuit module conductors c5 and c6 in conductor group g2 can be designed to accept bits 1 and 2 of an 8 bit wide signal delivered by interconnect bus conductors d5 and d6 regardless of the electronic circuit module's orientation relative to the interconnect bus conductors. Similarly, the four conductor group g0 having symmetrical members c1, c2, c9, and c10, could be designed to accept bits 3–6 respectively of the same 8 bit wide signal regardless of the electronic circuit module's orientation relative to the interconnect bus conductors. However, it is important that the electronic circuit module know which electronic circuit module conductor c1, c2, c9, or c10 in the electronic circuit module conductor group g0 is in contact with which interconnect bus conductor d1, d2, d9, and d10 in the interconnect bus conductor group g0 so that the electronic circuit module's bus interface 770 can accept bits 3–6 of the interconnect bus and route the bits in the proper order to an application circuit on the electronic circuit module.

Based on the concepts introduced with the FIG. 1a–1d interconnect bus system symmetry, FIGS. 2a–2d and 3 illustrate the physical configuration features of the interconnect bus system. FIGS. 4–7 illustrate the self-configuring features of the electronic circuit modules used with the interconnect bus system.

Interconnect Bus System Physical Configurations—FIGS. 2a–2d and 3

FIGS. 2a–2d illustrate the four orientations available to an electronic circuit module 200 relative to a plurality of rigid fixed position interconnect bus conductors d1 through dN stemming from interconnect bus base 215. Each interconnect bus conductor d1 through dN has a corresponding electronic circuit module conductor c1 through cN in a way that forms conductor groups as previously discussed in FIGS 1a–1d.

In the preferred embodiment of the present invention, the interconnect bus system contains 50 conductors whether viewed from the perspective of interconnect bus conductors or electronic circuit module conductors. The 50 conductors are subdivided into a single two conductor group containing two conductors, and 12 four conductor groups containing four conductors each. Assigning a function to each of the 50 conductors is subject to specific application design requirements. FIGS. 2a–2d illustrate "n" conductors in a double row for illustration purposes and no limitation is intended as to the number of conductors or the organization and location of the conductors.

In FIGS. 2a–2d, the electronic circuit module conductors c1 through cN are designed as "pass-through" receptacles. A pass-through receptacle allows rigid interconnect bus conductors d1 through dN to electrically mate with a corresponding electronic circuit module conductor c1 through cN by passing through each corresponding electronic circuit module conductor. The pass-through conductor design also allows multiple stacked electronic circuit modules as illustrated in FIG. 3. Other conductor types may be used to provide an electrically mating connection that include, but are not limited to, tongue and grove mating, indent and detent mating, and juxtaposed electrical conductor mating.

Figure 2A:
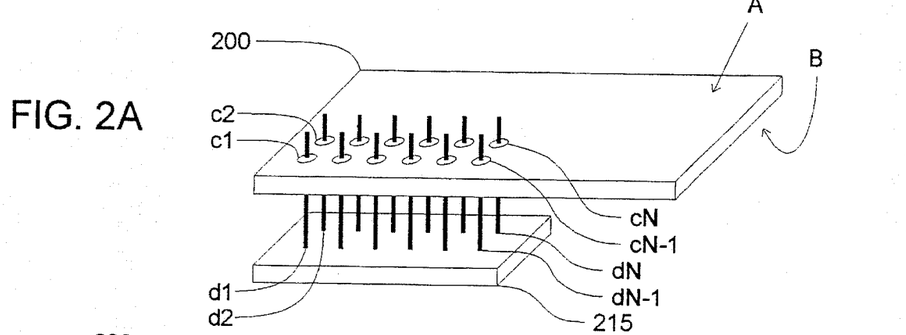
FIGS. 2a–2d illustrate four orientation options for an electronic circuit module relative to interconnect bus conductors.
Figure 3:
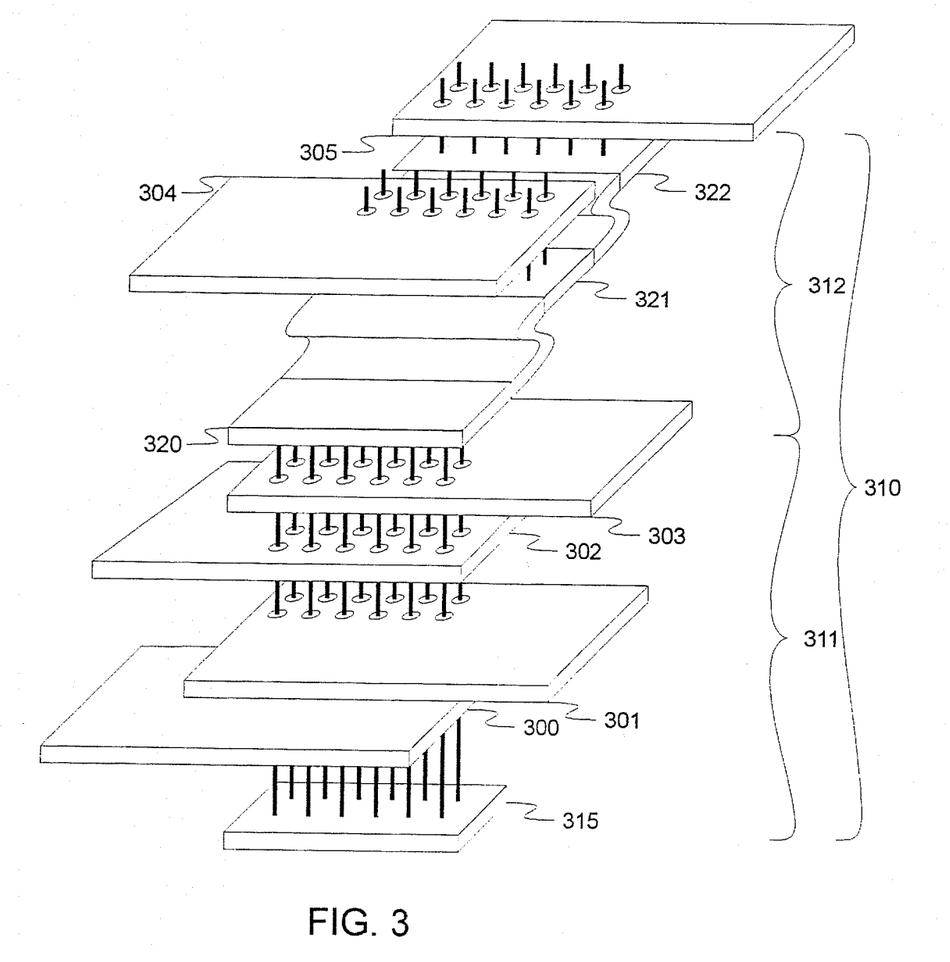
FIG. 3 illustrates multiple electronic circuit modules interconnected by rigid and flexible interconnect bus conductors.

FIG. 2a illustrates electronic circuit module 200 extending into the figure page in a first orientation where a surface A is showing and a surface B is not. In the first orientation option, electronic circuit module conductors c1, c2, through cN-1, and cN, are electrically mated one-to-one with interconnect bus conductors d1, d2, through dN-1, and dN respectively.

Figure 2B:
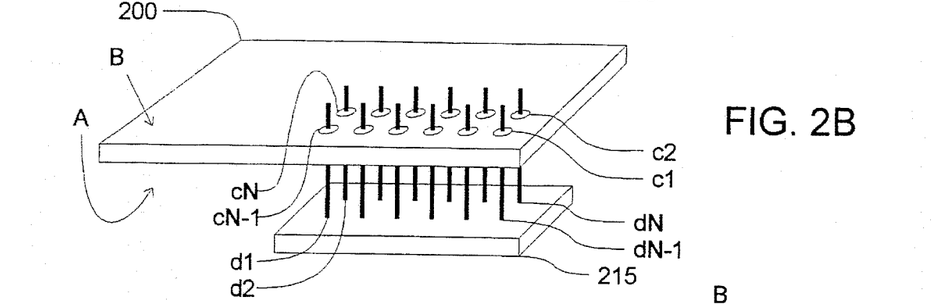

FIG. 2b illustrates electronic circuit module 200 extending into the figure page in a second orientation where surface B is showing and surface A is not showing. Here, interconnect bus conductors d1 and d2 correspond to electronic circuit module conductors cN-1 and cN respectively, while interconnect bus conductors dN-1 and dN correspond to electronic circuit module conductors c1 and c2 respectively.

Figure 2C:
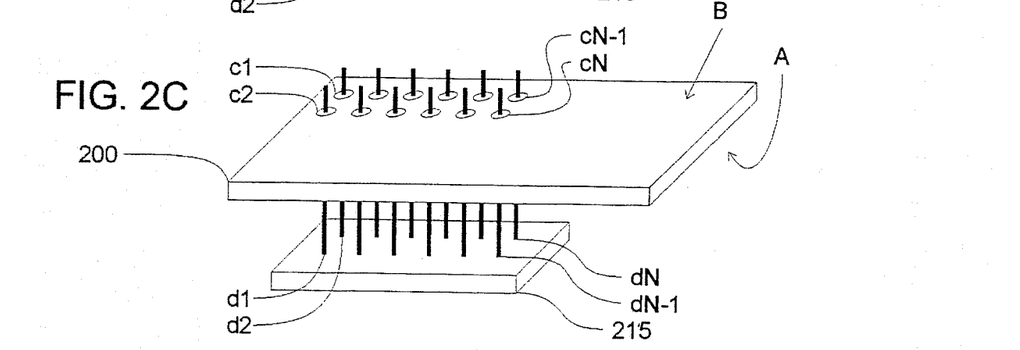

FIG. 2c illustrates electronic circuit module 200 extending out of the figure page in a third orientation where surface B is showing and surface A is not. Here, interconnect bus conductors d1 and d2 correspond to electronic circuit module conductors c2 and c1 respectively, while interconnect bus conductors dN-1 and dN correspond to electronic circuit module conductors cN and cN-1 respectively.

Figure 2D:
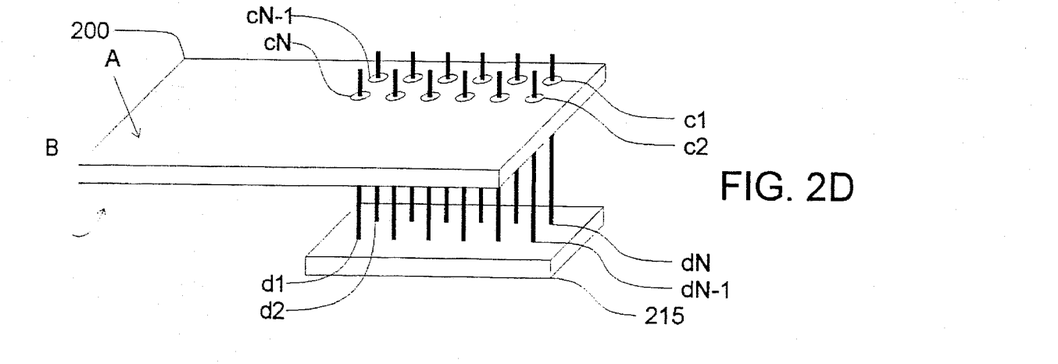

Finally, FIG. 2d illustrates electronic circuit module 200 extending out of the figure page in a fourth orientation where surface A is showing and surface B is not. Here, interconnect bus electrical conductors d1 and d2 correspond to electronic circuit module conductors cN and cN-1 respectively, while interconnect bus conductors dN-1 and dN correspond to electronic circuit module conductors c2 and c1 respectively.

FIG. 3 illustrates multiple electronic circuit modules 300–305 stacked along the length of a hybrid interconnect bus 310 in a random selection of the four orientations previously discussed. The hybrid interconnect bus 310 includes a rigid fixed position interconnect bus 311 stemming from electrical conductor base 315, and flexible cable interconnect bus 312 stemming from flexible cable interconnect bus blocks 320–322. Electronic circuit modules 300–303 are oriented relative to the rigid fixed position interconnect bus 311. Electronic circuit modules 304–305 are oriented relative to the flexible cable interconnect bus 312.

Figure 4:
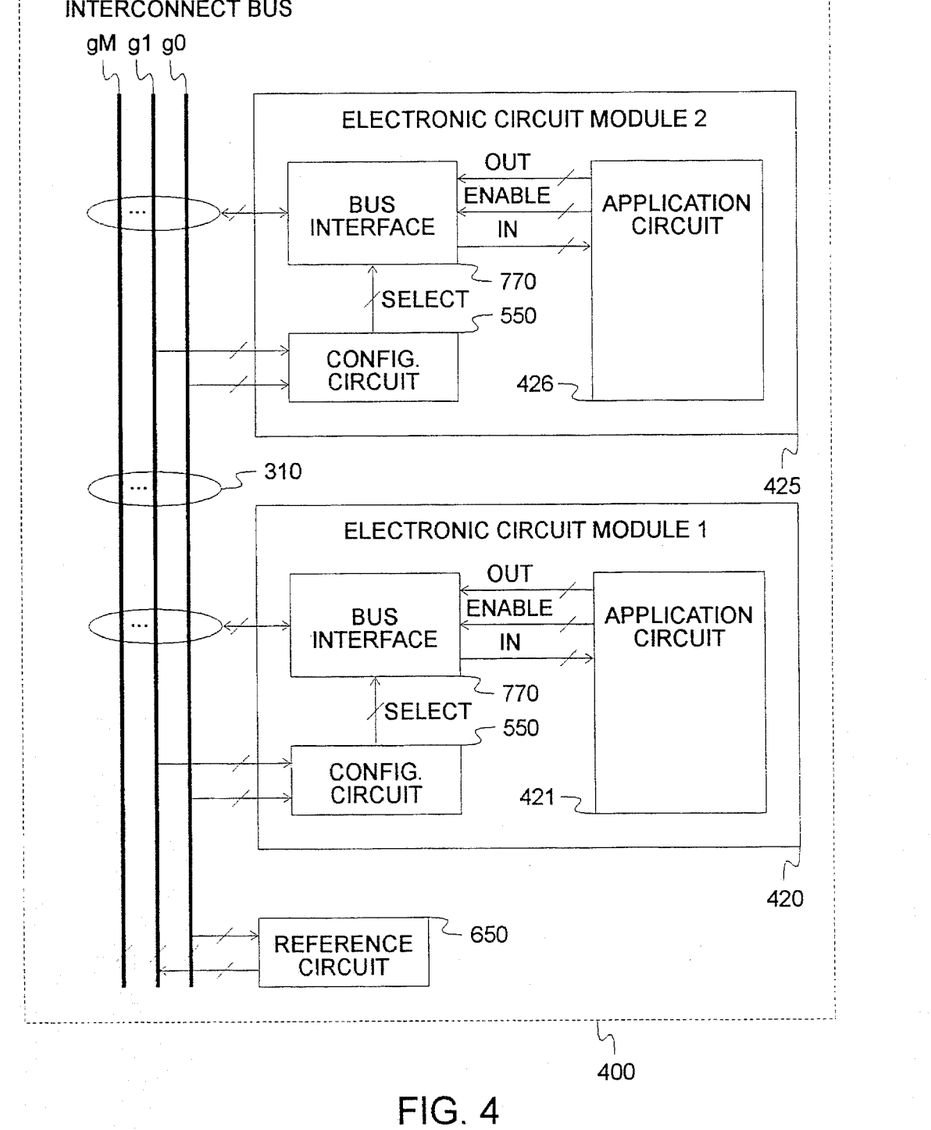
FIG. 4 illustrates an interconnect bus system overview in block diagram form.

Interconnect Bus System Overview—FIG. 4

FIG. 4 illustrates a block diagram overview of the interconnect bus system for use with self-configuring electronic circuit modules that illustrates the key electronic circuits embodied in the interconnect bus system. Electronic device 400 represents any electronic device such as a computer or any other device that contains at least one interconnect bus system. Electronic device 400 contains one interconnect bus 310 having two electronic circuit modules 420 and 425 connected thereto. It is important to note that the interconnect bus 310 does not require a master bus driver. The application circuits 421 and 426 on electronic circuit modules 420 and 425, respectively, contain the circuitry required to use the interconnect bus 310 subject to an overall application specific bus specification.

The interconnect bus 310 contains "m" conductor groups numbered g0 through gM. Two of the conductor groups, identified for discussion purposes as conductor groups g0 and g1 1, serve special functions. The first group g0 is a conductor group that carries a configuration signal used to indicate a configuration cycle. Any conductor group may be selected to carry the configuration signal and any electronic circuit module may produce the configuration signal when the application circuit on the electronic circuit module requires resetting by way of a reconfiguration. The second group g1 must be a conductor group containing the largest number of conductors in any one conductor group. Conductor group g1 is used to transmit a unique reference signal to each configuration circuit on each electronic circuit module so that the configuration circuit can determine which orientation is present for its electronic circuit module. The reference signal is produced only when the configuration signal is present on conductor group g0. Conductor group g1 can carry an ordinary operational signal for any operational use once the configuration cycle is complete.

Only one reference circuit 650 exists for the interconnect bus system. The reference circuit 650 can be located anywhere on interconnect bus 310 and is connected to conductor groups g0 and g1. Reference circuit 650 produces a unique reference signal on the interconnect bus 310 conductor group g1 during a configuration cycle so that configuration circuit 550 on electronic circuit modules 420 and 425 can sense the signal and determine which of the four orientation options exists with respect to the interconnect bus 310. The configuration signal must be present on conductor group g0 for the reference signal on conductor group g1 to have meaning. Reference circuit 650 only drives conductor group g1 during a configuration cycle when instructed to do so by any electronic circuit module 420 and/or 425 by way of conductor group g0. Conductor groups g0 and g1 can be reused as needed for operational signals during the operational cycle.

Each electronic circuit module 420 and 425 contains a configuration circuit 550, and bus interface 770. Once the configuration circuit 550 senses the reference signal produced by reference circuit 650 during a configuration cycle, the configuration circuit 550 configures the bus interface 770 by producing a continuous select signal. The select signal instructs bus interface 770 how to route signals to and from the interconnect bus 310 on behalf of the application circuits 421 and 426, respectively, in a manner transparent to the interconnect bus 310 and the application circuits 421 and 426 respectively.

Application circuits 421 and 426 are unique to the respective electronic circuit modules 420 and 425 on which they reside. The function of any one application circuit is application specific. Central to the invention, however, is that the orientation of electronic circuit modules 420 and 425 with respect to the interconnect bus 310, is transparent to the interconnect bus 310 and the application circuits 421 and 426 respectively.

Figure 5:
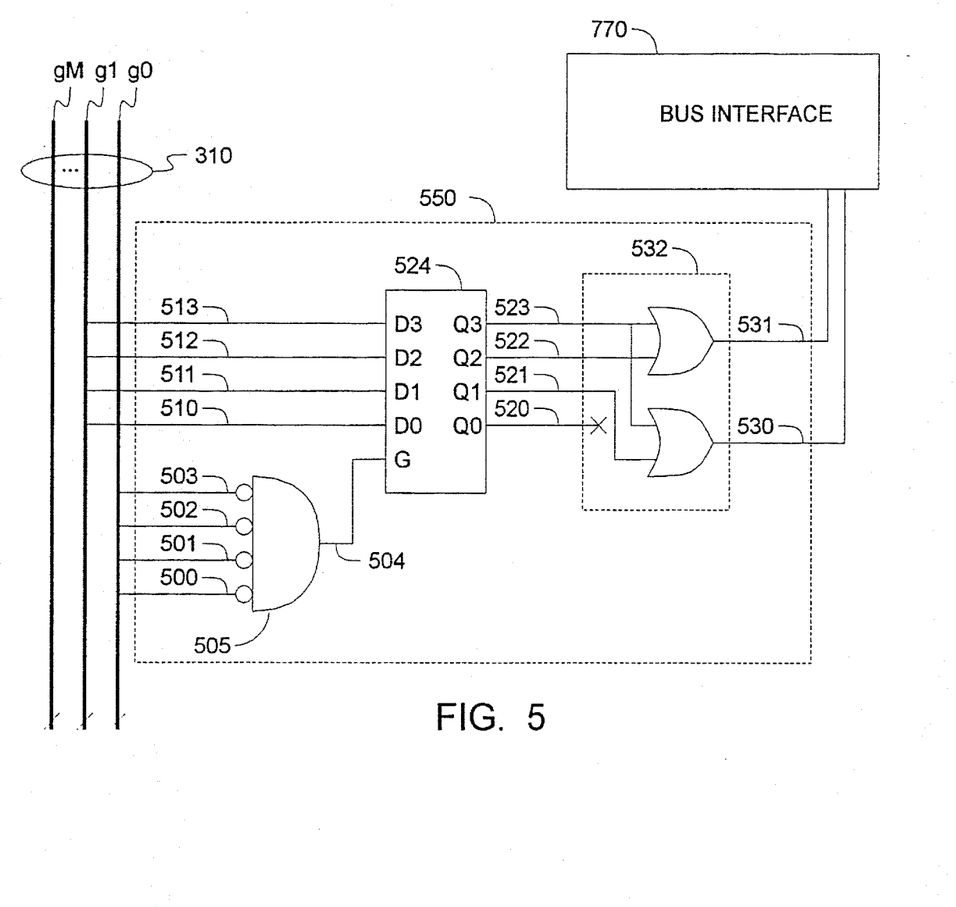
FIG. 5 illustrates an electronic circuit module configuration circuit.
Figure 6:
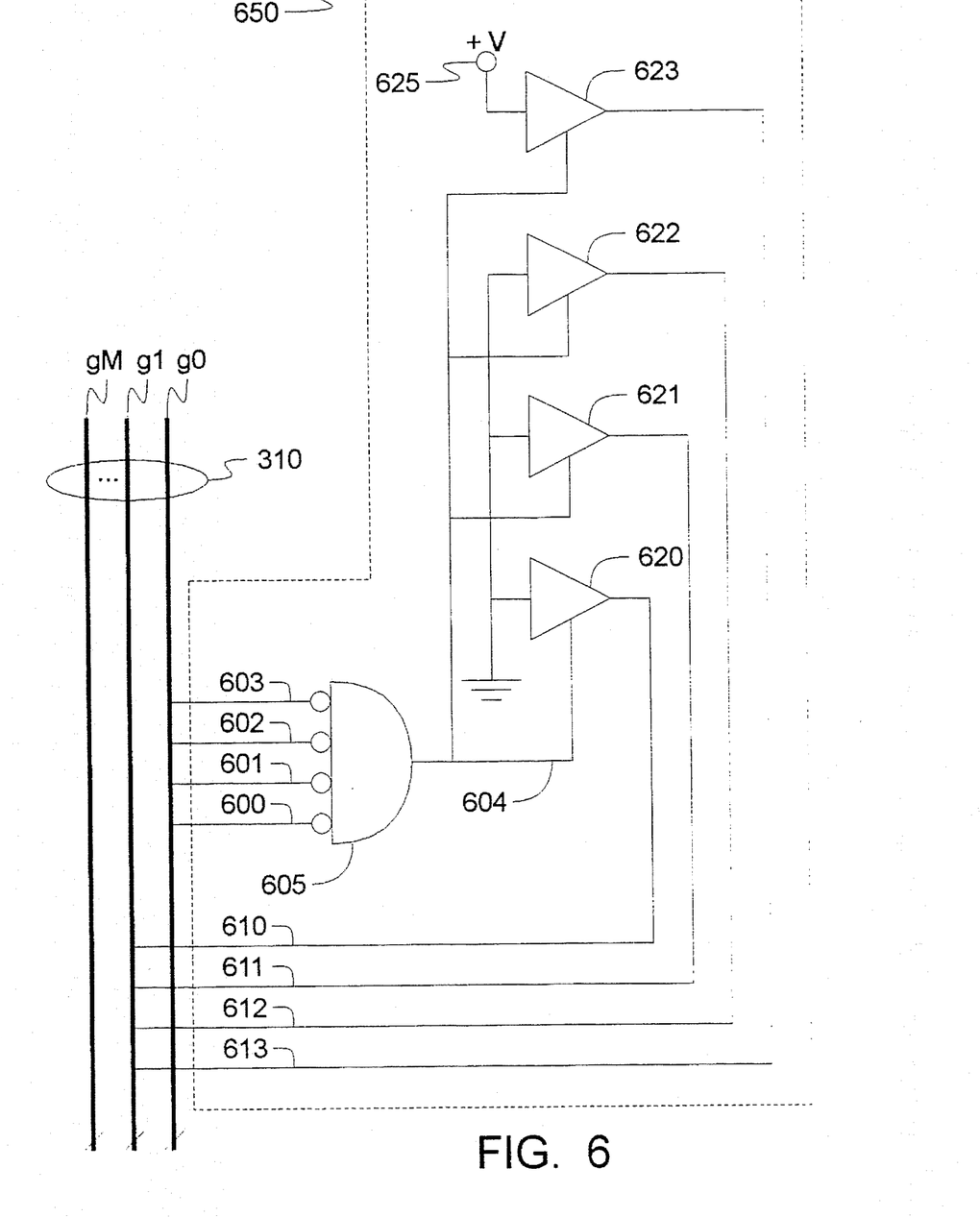
FIG. 6 illustrates the interconnect bus reference circuit.

Configuration and Reference Circuits—FIGS. 5 and 6

FIG. 5 illustrates a configuration circuit 550 that is present on every electronic circuit module. Configuration circuit 550 accepts inputs 500–503 from conductor group g0 of interconnect bus 310. Inputs 500–503 feed into NOR gate 505 which produces a logic 1 on output 504 to latch 524 when all inputs 500–503 are simultaneously logic 0. Determining whether inputs 500–503 will be all logic 0's or all logic 1's is a matter of design choice. A configuration cycle is indicated by forcing all the signals in conductor group g0 to the same state. In the preferred embodiment, all logic 0's on conductor group g0 indicates to configuration circuit 550 that each electronic circuit module 420 or 425 is entering a configuration cycle. Any of the electronic circuit modules 420 and/or 425 connected to interconnect bus 310 can produce the all logic 0 configuration signal on conductor group g0 by way of application circuit 421 or 426, thereby requesting that the interconnect bus system reset or reconfigure itself.

Although the preferred embodiment uses a four conductor group g0 to indicate a configuration cycle, any conductor group from among the interconnect bus conductors 310 can be used for this purpose as desired. However, unless the conductor group used to indicate the configuration cycle is dedicated to only that purpose, the application circuit must take precautions not to produce the configuration signal during an operational cycle or all electronic circuit modules in the interconnect bus system will be reset by way of a reconfiguration.

Configuration circuit 550 accepts inputs 510–513 from the four conductor group g1 of interconnect bus 310. Reference circuit 650 produces the reference signal on conductor group g1 that is sensed by the configuration circuit 550 inputs 510–513. The reference signal consists of one electrical conductor in conductor group g1 being in a logic state opposite the other three conductors in the conductor group. In the preferred embodiment the reference signal consists of one electrical conductor in group g1 being a logic 1 and the remaining three conductors a logic 0. Only three of the inputs 510–513 are needed to represent four orientations because depending on the orientation, the configuration circuit 550 inputs 510–513 will look like 000(1), 001(0), 010(0), or 100(0). Therefore, configuration circuit 550 can ignore either the high or low order bit, shown above as the parenthetical bit, is a "don't care" bit. Because the conductors in a four conductor group are uniquely positioned with respect to electronic circuit module conductors when the electronic circuit module is in any one of the four orientations discussed in FIGS. 2a–2d, configuration circuit 550 can sense the orientation based on the consistent reference signal discussed above.

inputs 510–513 feed latch 520 so that when gated by input 504, latch 520 produces four latched outputs 520–523 for encoding circuit 532. Encoding circuit 532 reduces the reference signal into a two output select signal 530–531 used to configure bus interface 770. Outputs 530–531 are the select signal leads that feed into and configure the bus interface 770. The select signals read as 00, 01, 10, or 11 to indicate which of the four orientation options is present. Alternatively, encoding circuit 532 could be eliminated to allow latch outputs 520–523 to pass through to the bus interface 770 unencoded.

FIG. 6 illustrates reference circuit 650 used by each electronic circuit module 420 and 425 to orient and configure itself relative to interconnect bus 310. Specifically, NOR gate 605 accepts configuration cycle request inputs 600–603 from interconnect bus 310 conductor group g0. When NOR gate 605 inputs 600–603 receive all logic 0's from conductor group g0, output 604 produces a logic 1 which enables each tri-state device 620–623 to subsequently produce outputs 610–613 respectively. Because tri-state devices 620–622 have inputs 630–632 tied to ground, when NOR gate 605 output 604 enables tri-state devices 620–622, logic 0's are produced on outputs 610–612 respectively. Tri-state device 623, however, has an input 633 from a positive voltage source 625 for a logic 1 input so that when NOR gate 605 output 604 enables tri-state device 623, a logic 1 is produced on output 613. Therefore, the reference signal placed on interconnect bus 310 conductor group g1 by reference circuit 650, is always a 0001 signal. Tri-state devices 620–623 produce a high impedance output when not enabled so that output from the devices appear as an open circuit. Depending on an electronic circuit module's orientation, the reference signal is either 0001, 0010, 0100, or 1000.

In an alternative embodiment, signals 600–603 could be dedicated to always produce the reference signal by Wiring the appropriate leads directly to power and ground thereby eliminating the need for tri-state devices 620–623, gate 605, gate 505, and latch 520. However, in such an alternative embodiment, the conductor group used to carry the reference signal would be dedicated only to carrying the reference signal and nothing else. In an effort to minimize the number of conductors needed by the interconnect bus system, the preferred embodiment implements both the configuration circuit 550 and reference circuit 650 so that conductor ;group g1 of the interconnect bus 310 can be used to carry ordinary operational signals for ordinary operational purposes during the operational cycles once the configuration cycle is complete.

Figure 7:
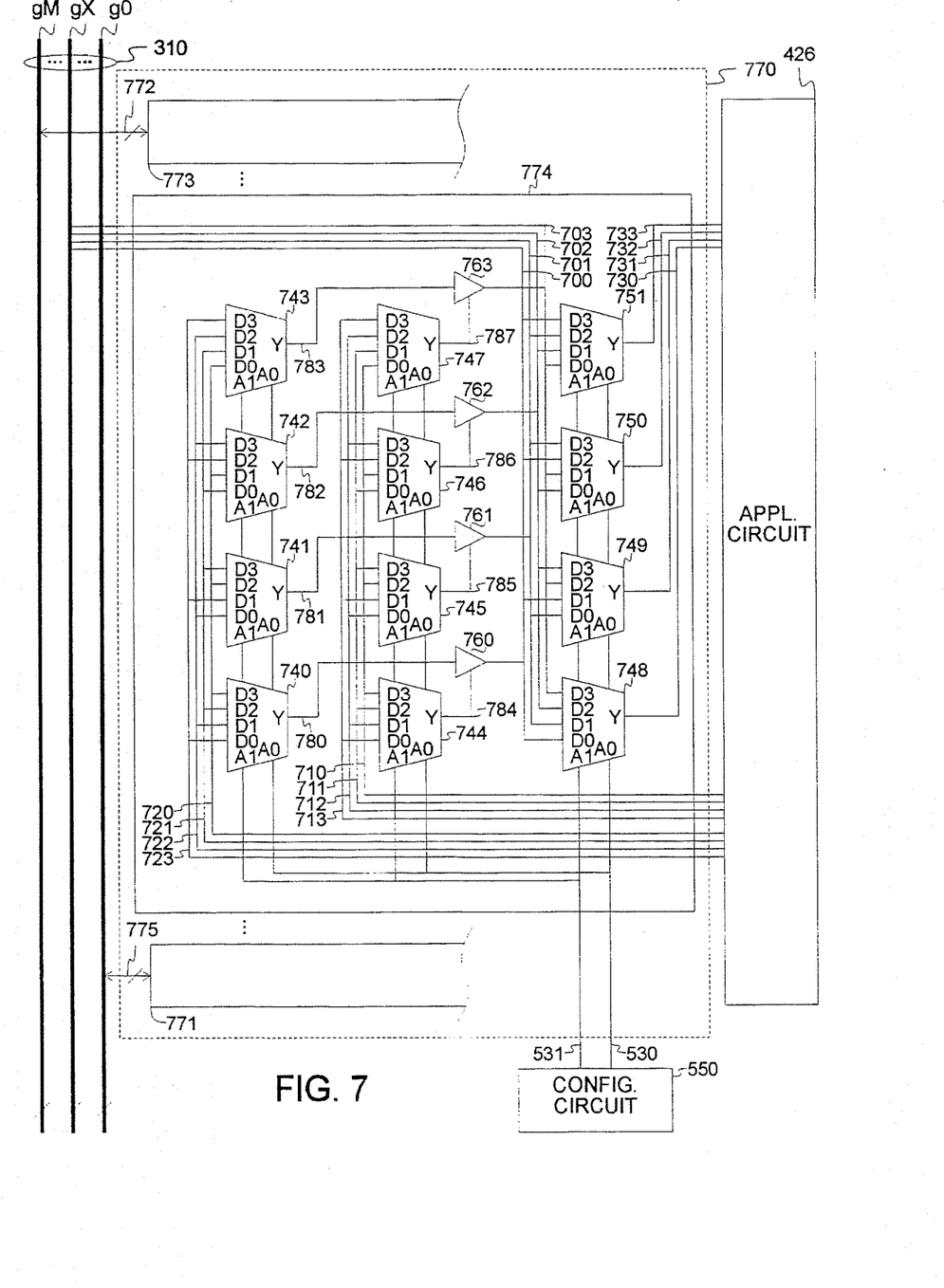
FIG. 7 illustrates an electronic circuit module bus interface circuit.

Bus Interface—FIG. 7

FIG. 7 illustrates the circuitry 774 within bus interface 770 used to route signals to and from a four conductor group gX of the interconnect bus 310. The purpose of bus interface 770 is to route application circuit 426 inputs 730–733 and outputs 710–713, to and from the appropriate interconnect bus conductors 700–703 within conductor group gX of interconnect bus 310.

Operationally, application circuit 426 accepts inputs 730–733 from interconnect bus 310 conductor group gX containing interconnect bus conductors 700–703. The interconnect bus conductors 700–703 are routed in each of four multiplexers 748–751 based on select signal inputs 530–531 from configuration circuit 550. The select signal inputs 530–531 indicate the orientation of the electronic circuit module 425 relative to interconnect bus 310. Each multiplexer 748–751 produces a routed signal on application inputs 730–733 which pass directly into application circuit 426 for purposes beyond the scope of the present invention.

Output from application circuit 426 is routed through application outputs 710–713 and into each of four multiplexers 740–743 for routing based on select signal inputs 530–531 from configuration circuit 550. Select signal inputs 530–531 indicate the orientation of the electronic circuit module 425 relative to interconnect bus 310. Each multiplexer 740–743 produces a routed signal 780–783 that passes directly into tri-state devices 760–763 which when enabled, allows the routed signals 780–783 to pass onto interconnect bus conductors 700–703 of interconnect bus 310 conductor group gX.

Because the interconnect bus conductors 700–703 are bi-directional, it is necessary to route output from application circuit 426 through tri-state devices 760–763 to avoid input/output collisions on interconnect bus 310. Therefore, application circuit 426 must send an output enable signal on output enable conductors 720–723 concurrently with output on application output leads 710–713 before application circuit 426 can write to interconnect bus 310. The output signals can pass directly to the interconnect bus conductors 700–703 when the tri-state devices 760–763 are enabled by routed enable signals 784–787. Tri-state devices 760–763 output a high-impedance output when not enabled so that the respective output appears as an open circuit. Output enable conductors 720–723 are routed into each of four multiplexers 744–747 for routing based on select signal inputs 530–531 from configuration circuit 550 which indicate the orientation of the electronic circuit module 425 relative to interconnect bus 310.

Circuits 775 and 773 contain routing circuitry for conductor groups g0 and gM respectively. Circuits 775 and 773, and any other routing circuits required for each conductor group within interconnect bus 310, contain similar input, output, and enable leads to and from application circuit 426 as illustrated in circuit 774. However, a conductor group having only two conductor members only requires six two-input multiplexers and two tri-state devices for the respective input, output, and enable leads from application circuit 426. A conductor group containing only one conductor member requires only a single tri-state device with an enable lead to control output onto the bi-directional interconnect bus conductor leading to interconnect bus 310. Any interconnect bus conductor carrying power or ground for the electronic circuit module must be handled accordingly in a manner well known in the art that is separate from the typical input, output, and enable leads and gates required for an interconnect bus conductor used for communications or signaling in an ordinary operational cycle.

Figure 8:
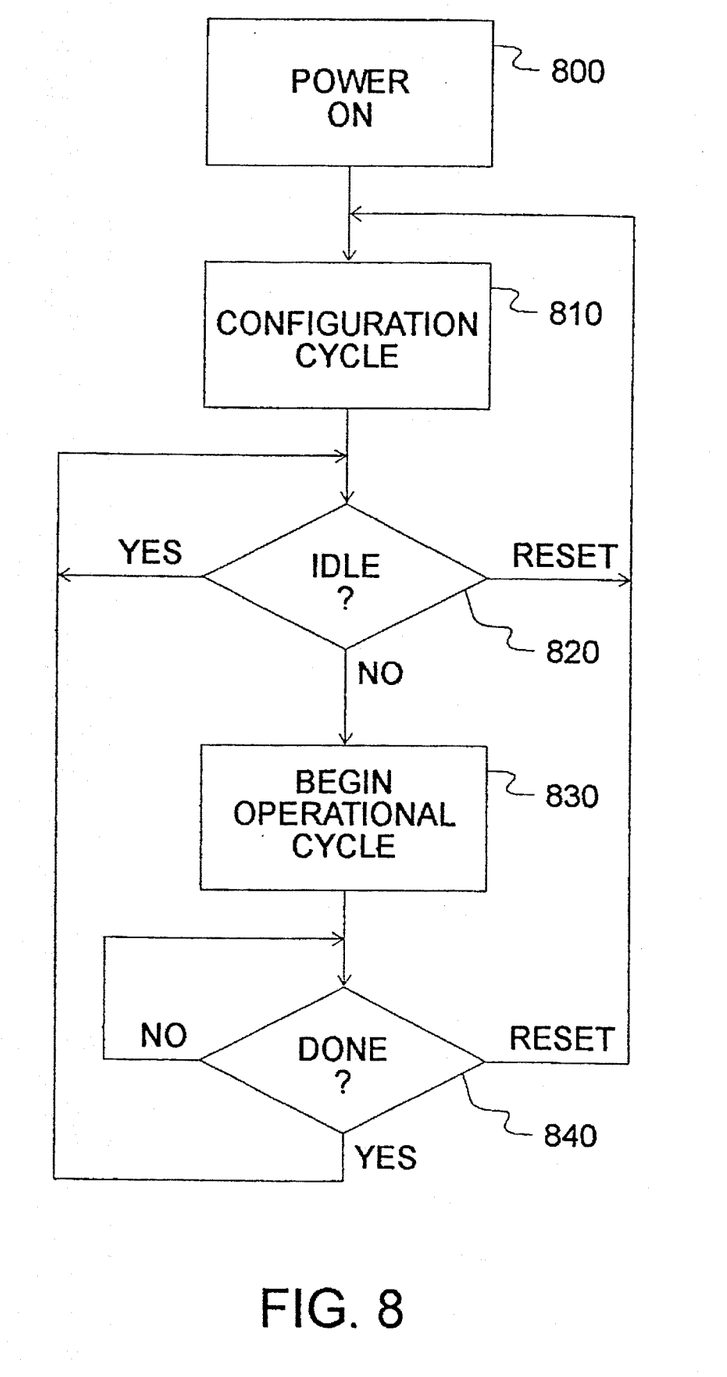
FIG. 8 illustrates the interconnect bus system configuration and operational cycles in flow diagram form.

Operational Flow, FIG. 8

FIG. 8 illustrates the overall operational flow through the power-up, configuration cycle, and operational cycles for any electronic circuit module such as 420 for example. When an electronic device 400 having the present invention embodied therein, is powered on at step 800, the application circuit 421 on electronic circuit module 420 produces a configuration signal on conductor group g0 indicating that the physical orientation is unknown at configuration cycle step 810. The configuration cycle continues at step 810 by the reference circuit 650 producing a reference signal on conductor group g1. The reference signal is sensed by configuration circuit 550 on electronic circuit module 420 and the orientation is determined based on the reference signal. A select signal is produced to configure the bus interface 770 at the completion of the configuration cycle in step 810. The configuration cycle occurs as discussed in the text accompanying FIGS. 5 and 6.

Once the configuration cycle is complete, the bus interface 770 is configured to route signals to and from the interconnect bus 310 on behalf of application circuit 421, and the interconnect bus system enters an idle state at decision step 820 until an operational cycle occurs. If an operational cycle is required at decision step 820, the appropriate operational cycle begins at step 830. Operational cycles include, but are not limited to, read cycles, write cycles, error reporting cycles, and arbitration cycles. When the operational cycle is complete at decision step 840, the application circuit 421 returns to an idle state at decision step 820.

At any time during idling at decision step 820 or an operational cycle at steps 830–840, a hard or soft reset may occur by error, command, or system failure. If a reset occurs, processing continues at the configuration step 810 where configuration circuit 550 senses the reference signal from reference circuit 650, and determines the electronic circuit module 420 orientation once again relative to interconnect bus 310. Once electronic circuit module has been reconfigured, each electronic circuit module idles once again at step 820 or begins operational cycles at step 830 as previously discussed.

All operational cycles are transparent to the reference circuit 650, configuration circuits 550, and bus interfaces 770. For example, power distribution, data transfer cycles, error reporting, interrupt mechanisms, and arbitration mechanisms, are all operational cycles that are well known in the art and can be implemented within the application circuit on the respective electronic circuit modules or as part of a generic electronic circuit module management interface that services a specific application circuit. Each of these transparent transactions begin at the operational cycle step 830 and continue at step 840 until complete or until a subsequent reset occurs.

SUMMARY

The interconnect bus system using self-configuring electronic circuit modules of the present invention provides multiple orientation options for electronic circuit modules relative to a plurality of fixed position interconnect bus conductors. The electronic circuit modules can sense a reference circuit to determine the electronic circuit module orientation relative to the interconnect bus, and configure a bus interface to route signals to and from the interconnect bus on behalf of an application circuit in a manner transparent to the application circuit. While specific embodiments of this invention are disclosed herein, it is expected that those skilled in the art can and will design alternate embodiments that fall within the scope of the following claims.

What is claimed is:

1. An interconnect bus system comprising:
   an electronic circuit module having a plurality of electronic circuit module conductors and an application circuit thereon;
   an interconnect bus having a plurality of interconnect bus conductors;
   means for connecting said plurality of electronic circuit module conductors to said plurality of interconnect bus conductors in one of a plurality of orientations;
   means responsive to said connecting means for configuring said electronic circuit module based on said one of said plurality of orientations; and means responsive to said configuring means for interfacing said application circuit with said plurality of interconnect bus conductors.

2. A system according to claim 1 wherein said connecting means includes:
   means for mating said plurality of electronic circuit module conductors with said plurality of interconnect bus conductors in at least one electrically conductive manner selected from the group consisting of: a pass-through receptacle and a pin, a tab and a slot, and juxtaposed electrical conductors.

3. A system according to claim 1 wherein said plurality of interconnect bus conductors are of at least one type selected from the group consisting of: rigid and substantially flexible.

4. A system according to claim 1 further including:
   means for interconnecting a plurality of electronic circuit modules having said plurality of interconnect bus conductors therebetween.

5. A system according to claim 1 wherein said configuring means includes:
   means for generating a reference signal on a conductor group from among said plurality of interconnect bus conductors; and
   means for sensing said reference signal by said electronic circuit module to distinguish which of said one of said plurality of orientations exists for said electronic circuit module relative to said interconnect bus.

6. A system according to claim 1 wherein said interfacing means includes:

means for routing an incoming plurality of signals to said application circuit and an outgoing plurality of signals from said application circuit to an appropriate one of said plurality of interconnect bus conductors in a manner transparent to said application circuit.

7. A system according to claim 1 further including:

means for reconfiguring said electronic circuit module at any time subsequent to a first configuration cycle.

8. A system according to claim 6 further including:

means for disputing power over at least one of said plurality of interconnect bus conductors;

means for controlling data transfer cycles over at least one of said plurality of interconnect bus conductors, including a write cycle and a read cycle;

means for controlling arbitration cycles among a plurality of electronic circuit modules;

means for reporting errors over at least one of said plurality of interconnect bus conductors; and means for reporting interrupt conditions over at least one of said plurality of interconnect bus conductors.

9. A method for using an interconnect bus system that includes an electronic circuit module having a plurality of electronic circuit module conductors and an application circuit thereon, and an interconnect bus having a plurality of interconnect bus conductors, said method comprising the steps of:

connecting said plurality of electronic circuit module conductors to said plurality of interconnect bus conductors in one of a plurality of orientations, wherein said plurality of interconnect bus conductors are of at least one type selected from the group consisting of: rigid and substantially flexible;

configuring said electronic circuit module based on said one of said plurality of orientations in response to said connecting step; and interfacing said application circuit with said plurality of interconnect bus conductors in response to said configuring step.

10. A method according to claim 9 wherein said connecting step includes:

mating said plurality of electronic circuit module conductors with said plurality of interconnect bus conductors in at least one electrically conductive manner selected from the group consisting of: a pass-through receptacle and a pin, a tab and a slot, and juxtaposed electrical conductors.

11. A method according to claim 9 further including:

interconnecting a plurality of electronic circuit modules having said plurality of interconnect bus conductors therebetween.

12. A method according to claim 9 wherein said configuring step includes:

generating a reference signal on a conductor group from among said plurality of interconnect bus conductors; and sensing said reference signal by said electronic circuit module to distinguish which of said one of said plurality of orientations exists for said electronic circuit module relative to said interconnect bus.

13. A method according to claim 9 wherein said interfacing step includes:

routing an incoming plurality of signals to said application circuit and an outgoing plurality of signals from said application circuit to an appropriate one of said plurality of interconnect bus conductors in a manner transparent to said application circuit.

14. A method according to claim 9 further including:

reconfiguring said electronic circuit module at any time subsequent to a first configuration cycle.

15. A method according to claim 13 further including:

distributing power over at least one of said plurality of interconnect bus conductors;

controlling data transfer cycles over at least one of said plurality of interconnect bus conductors, including a write cycle and a read cycle;

controlling arbitration cycles among a plurality of electronic circuit modules;

reporting errors over at least one of said plurality of interconnect bus conductors; and reporting interrupt conditions over at least one of said plurality of interconnect bus conductors.

* * * * *